(12) United States Patent
Greenwell

(10) Patent No.: US 6,622,903 B1
(45) Date of Patent: Sep. 23, 2003

(54) PRODUCTION OF A TAILLESS BALL BUMP

(75) Inventor: Mark S. Greenwell, San Marcos, CA (US)

(73) Assignee: Palomar Technologies, Inc., Vista, CA (US)

( * ) Notice: Subject to any disclaimer, the term of this patent is extended or adjusted under 35 U.S.C. 154(b) by 0 days.

(21) Appl. No.: 10/108,038

(22) Filed: Mar. 27, 2002

(51) Int. Cl.[7] .............................. B23K 1/06; B23K 31/02
(52) U.S. Cl. .................. 228/110.1; 228/155; 228/180.5
(58) Field of Search ................................ 228/180.5, 4.5, 228/155, 160, 170, 173.1, 173.5, 110.1, 1.1

(56) References Cited

U.S. PATENT DOCUMENTS

| | | | | |
|---|---|---|---|---|
| 4,442,967 A | * | 4/1984 | van de Pas et al. ......... | 228/159 |
| 5,058,798 A | * | 10/1991 | Yamazaki et al. ........ | 228/110.1 |
| 5,060,843 A | * | 10/1991 | Yasuzato et al. .......... | 228/179.1 |
| 5,132,772 A | * | 7/1992 | Fetty .......................... | 257/779 |
| 5,172,851 A | * | 12/1992 | Matsushita et al. ..... | 228/180.22 |
| 5,485,949 A | * | 1/1996 | Tomura et al. ........... | 228/180.5 |
| 5,559,054 A | * | 9/1996 | Adamjee .................... | 438/617 |
| 5,953,624 A | * | 9/1999 | Bando et al. ............... | 438/617 |
| 6,102,275 A | | 8/2000 | Hill et al. ................. | 228/180.5 |
| 6,163,463 A | * | 12/2000 | Marrs .......................... | 361/773 |
| 6,244,499 B1 | * | 6/2001 | Tsai et al. ................. | 228/180.5 |
| 6,260,753 B1 | * | 7/2001 | Renard et al. .............. | 228/155 |
| 6,291,269 B1 | * | 9/2001 | Kira et al. ................... | 438/110 |

OTHER PUBLICATIONS

CBT 6000 Release Notes, Palomar Technologies, Inc., Oct. 12, 2000, p. 27.

* cited by examiner

*Primary Examiner*—Tom Dunn
*Assistant Examiner*—Kiley Stoner
(74) *Attorney, Agent, or Firm*—Rodney F. Brown

(57) ABSTRACT

A method of producing a ball bump on a workpiece employs a capillary having a passageway therethrough. A wire extends through the passageway and has a ball formed on its end below the capillary. The capillary is positioned above a bond site and is lowered until the ball contacts the bond site. The capillary simultaneously applies ultrasonic energy and a downward force against the ball to deform the ball to a ball bump and bond it to the bond site. The capillary is thereafter displaced in a first direction to break the wire away from the ball bump. The capillary is then displaced in a second direction across the ball bump to engage any residual wire protruding from the ball bump surface and substantially smooth the residual wire against the ball bump surface.

23 Claims, 5 Drawing Sheets

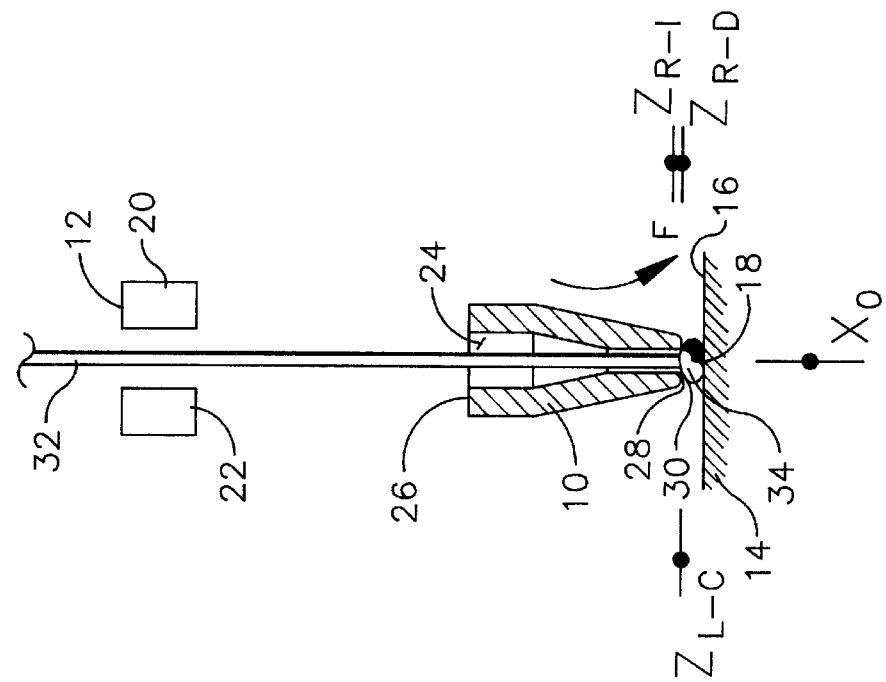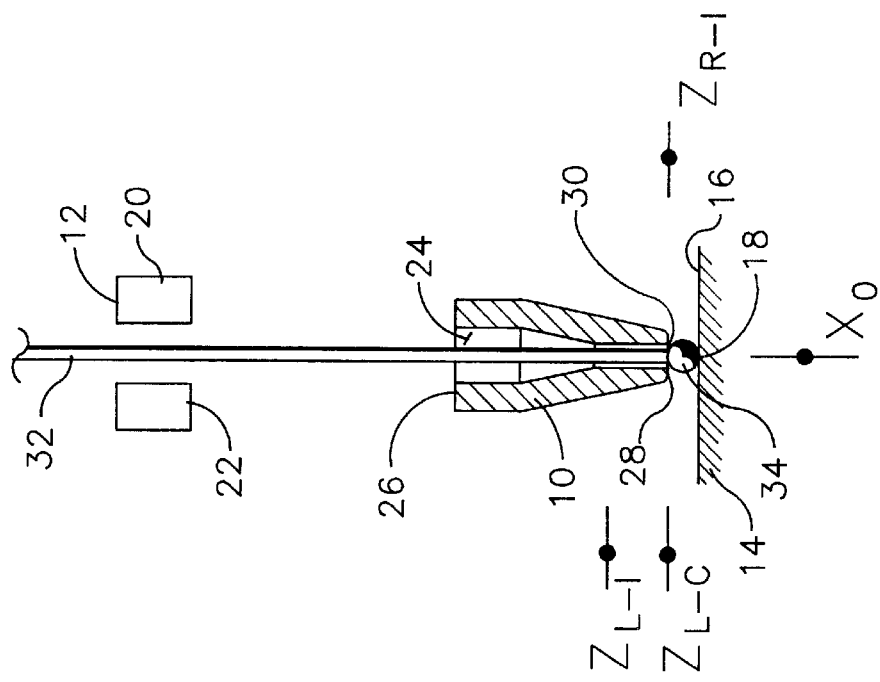

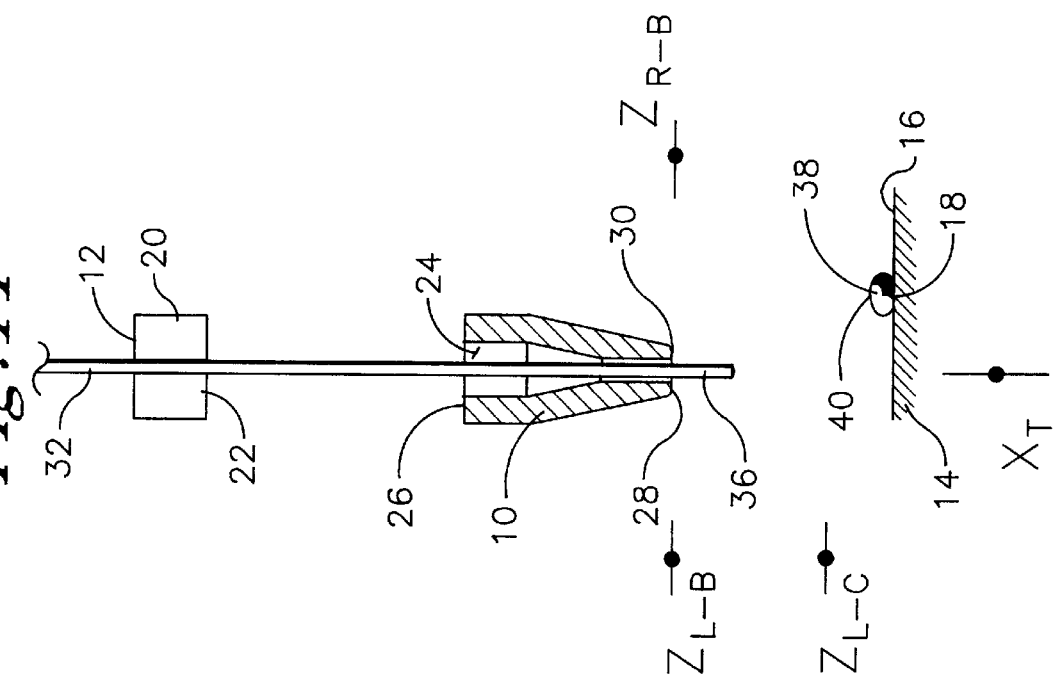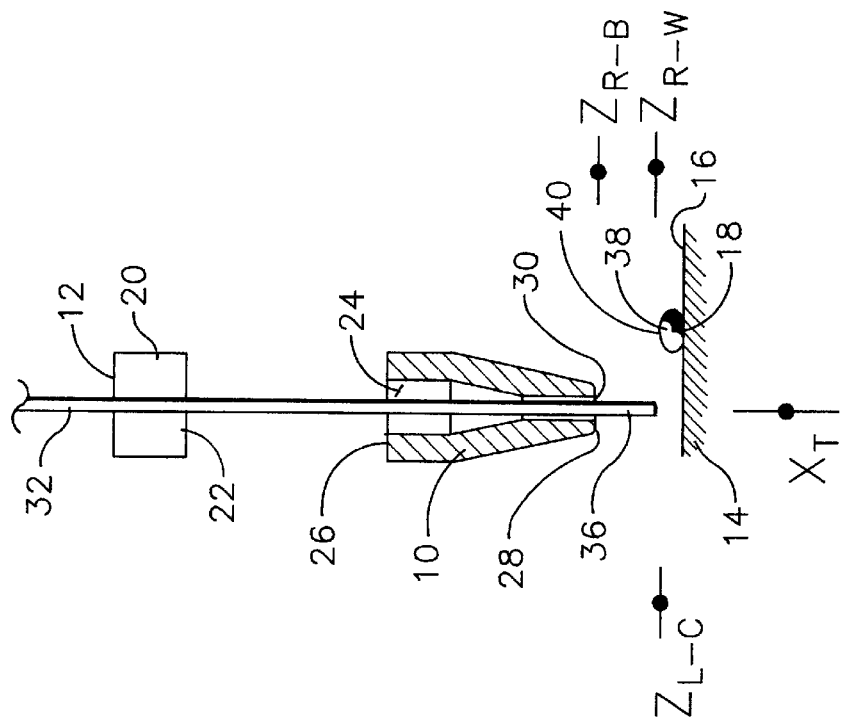

PRODUCTION OF A TAILLESS BALL BUMP

TECHNICAL FIELD

The present invention relates generally to automated bonding, and more particularly to a method for accurately producing a ball bump on a surface which is used to provide a conductive bond with another surface.

BACKGROUND OF THE INVENTION

Ball bumps have specific utility in microelectronic applications for conductively bonding one surface of a workpiece to another surface of a workpiece at predetermined bond sites on the surfaces. The workpiece is typically a wafer or a substrate having a planar surface and the bond sites are precisely defined areas on the surfaces of the wafer or substrate. The wafer and/or substrate is ultimately used in the fabrication of a microelectronic device after further processing. For example, a wafer typically consists of a plurality of interconnected die sharing a continuous common surface. Each die is a tiny semiconductor components, such as a diode, transistor or integrated circuit, which has a bond site on the continuous common surface. A ball bump is produced at every bond site on the wafer and the wafer is then cut into individual die. Thereafter, each individual die is bonded to a corresponding bond site on a substrate by means of the ball bump which is bonded to the bond site on the individual die. The substrate is typically a planar structure substantially larger than the individual die such as a printed circuit or an integrated circuit package.

Ball bumps are commonly formed on bond sites by a machine automated technique, wherein the end of a very fine electrically-conductive metal wire is played out through the end of a capillary, which serves as a wire guide. The end of the wire is flamed to melt the wire and the resulting molten metal beads up to create a ball beneath the end of the capillary, which remains attached to the wire when cooled. The end of the capillary is aligned over the desired bond site on a surface and the end of the capillary is lowered down toward the bond site to place the ball on the bond site. The end of the capillary is lowered further still, compressing the ball against the bond site. The compression caused by the capillary in conjunction with energy applied to the ball from an external source bonds the ball to the bond site while flattening the ball to reduce its height and increasing its areal spread. Once the ball is flattened, the end of the capillary is drawn away from the bond site to break the connection between the wire and the ball, leaving a newly formed ball bump on the bond site.

The ball bump may then be used to bond the first surface, to which the ball bump has been bonded, to a second surface. Bonding of the two surfaces is effected by aligning the ball bump on the first surface with a bond site on the second surface and forcing the ball bump against the bond site while simultaneously heating or otherwise applying energy to the ball bump. A thermal or mechanical compression force forms between the ball bump and second surface, thereby bonding the first and second surfaces together. Because the ball bump is formed from an electrically conductive metal, the ball bump functions not only as an adhesive for the bond between the two surfaces, but as an electrical conductor between the two surfaces.

Accurate shaping of the ball bump at the bond site of the first surface is critical to the quality of the resulting bond between the first and second surfaces. If the ball bump spills outside the defined boundaries of the desired bond sites on either surface, the ball bump may encroach into operating areas of the surfaces and diminish the overall operation of the microelectronic device in which the surfaces are employed. Moreover, if the top surface of the ball bump is uneven or too high upon its formation, the non-conforming character of the top surface may disrupt the ability to properly bond the first and second surfaces together. Accordingly, tolerances for the ball bump in all three dimensions X, Y, and Z are very strict for certain microelectronic applications, being on the order of about 1 to 5 microns.

It has been found that prior art methods for producing ball bumps are oftentimes unable to satisfy the strict performance requirements of many microelectronics applications. In high-speed production runs, practical considerations limit the period of time allotted to produce each ball bump, which compounds the difficulty in meeting the required dimensional tolerances for the ball bumps. For example, the step of breaking the attachment between the wire and the ball at high speed to produce the ball bump frequently leaves a residual "tail" of wire extending from the top surface of the ball bump, which may be disruptive to subsequent bonding of the ball bump to another surface. As such, the present invention recognizes a need for a method of accurately and repetitively producing tailless ball bumps at a high rate of speed.

Accordingly, it is an object of the present invention to provide a method of producing a tailless ball bump. More particularly, if is an object of the present invention to provide such a method which is fully automated and computer controlled. It is another object of the present invention to provide such a method which can be accurately repeated many times over. It is still another object of the present invention to provide such a method which can be performed at a high rate of speed. It is a further object of the present invention to provide such a method which can produce a plurality of dimensionally consistent ball bumps, and more particularly a plurality of ball bumps having a uniform desirable height, at a high rate of speed. These objects and others are accomplished in accordance with the invention described hereafter.

SUMMARY OF THE INVENTION

The present invention is a method of producing a tailless ball bump on a workpiece. A selectively positionable capillary is provided having a passageway therethrough and having an opening from the passageway out of the capillary. A wire is positioned in the passageway and an end of the wire is extended from the opening. A ball is positioned on the end of the wire which has a ball height. The capillary is positioned proximal to a working surface on a workpiece and the ball is positioned on a bond site on the working surface. The capillary applies a force against the ball in a direction of the bond site to transform the ball to a ball bump. The ball bump has a top surface and a ball bump height above the working surface, which is less than the ball height. The ball bump becomes bonded to the bond site upon formation. The capillary is displaced thereafter in a first direction away from the ball bump to detach the wire from the ball bump. A residual wire tail, which extends away from the top surface of the ball bump, is formed when the wire is detached from the ball bump. The capillary is displaced in a second direction across the top of the ball bump to engage the residual wire tail, return the residual wire tail to the top surface of the ball bump, and substantially flatten the residual wire tail against the top surface of the ball bump. The second direction is preferably a horizontal direction substantially opposite the first direction. The above-recited steps may be repeated as often as desired to form additional ball bumps on separate bond sites, which are on the same workpiece or on different workpieces. The above-recited method may further include the step of applying energy to the ball, preferably in the form of ultrasonic energy and/or heat energy, while applying the force to the ball.

In accordance with another embodiment, the method of present invention provides a bond head having a selectively positionable capillary and wire clamp, which cooperatively produce a tailless ball bump. The wire clamp is selectively positionable in an open position or a closed position and is mounted on the bond head above the capillary. The capillary is positioned along a vertical linear axis at a vertical linear point and along a vertical rotary axis at a vertical rotary point. A bond site on a working surface of the workpiece is positioned along a horizontal linear axis at a horizontal bond point. A wire extends from the capillary and wire clamp and an end of the wire is positioned beneath the capillary. A ball is suspended from the end of the wire.

To form a ball bump, the wire clamp is initially maintained in the open position enabling displacement of the wire relative to the wire clamp. The capillary is displaced along the vertical linear axis to a vertical linear contact point beneath the vertical linear point, thereby positioning the ball on the bond site. The capillary applies a force along the vertical rotary axis against the ball in a direction of the bond site and energy is transmitted through the capillary to the ball. The action of the capillary deforms the ball and bonds the ball to the bond site. Deformation of the ball causes radial displacement of the capillary along the vertical rotary axis from the vertical rotary point to a vertical rotary deformation point. The sum of these effects forms the ball bump, although it still has the wire attached to and extending from its surface.

To detach the wire, the capillary is radially displaced along the vertical rotary axis which withdraws the force from against the surface of the ball bump. The wire clamp is repositioned from the open position to the closed position to releasably fix the wire relative to the wire clamp. The capillary is displaced along the horizontal linear axis to a horizontal wire shear point away from the horizontal bond point, thereby detaching the wire from the ball bump. Detaching the wire forms a residual wire tail which extends from the surface of the ball bump. To remove the residual wire tail, the capillary is displaced along the horizontal linear axis away from the horizontal wire shear point across the surface of the ball bump to a horizontal tail removal point on another side of the horizontal bond point from the horizontal wire shear point. As the capillary is displaced, it engages the residual wire tail and returns the residual wire tail to the surface of the ball bump.

The present invention will be further understood from the drawings and the following detailed description.

BRIEF DESCRIPTION OF THE DRAWINGS

FIGS. 2–6, 8, 10 and 11 are diagrammatic views of a capillary, wire clamp, and wire, which show the motive steps of the capillary and wire clamp and their effect on the wire during the practice of one production cycle of the tailless ball bump production method of the present invention.

In particular, FIG. 2 is a diagrammatic view of the capillary, wire clamp and wire in their initial positions at the initiation of the production cycle.

FIG. 3 is a diagrammatic view of the capillary, wire clamp and wire after an initiating step of the production cycle.

FIG. 4 is a diagrammatic view of the capillary, wire clamp and wire after a first positioning step of the production cycle.

FIG. 5 is a diagrammatic view of the capillary, wire clamp and wire after a bonding step of the production cycle.

FIG. 6 is a diagrammatic view of the capillary, wire clamp and wire after a wire shearing step of the production cycle.

FIG. 7 is a conceptualized blow-up view of the ball bump of FIG. 6.

FIG. 8 is a diagrammatic view of the capillary, wire clamp and wire after a residual wire tail removal step of the production cycle.

FIG. 9 is a conceptualized blow-up view of the ball bump of FIG. 8.

FIG. 10 is a diagrammatic view of the capillary, wire clamp and wire after a wire segment exposure step of the production cycle.

FIG. 11 is a diagrammatic view of the capillary, wire clamp and wire after a second positioning step of the production cycle.

DESCRIPTION OF PREFERRED EMBODIMENTS

Figure 1:
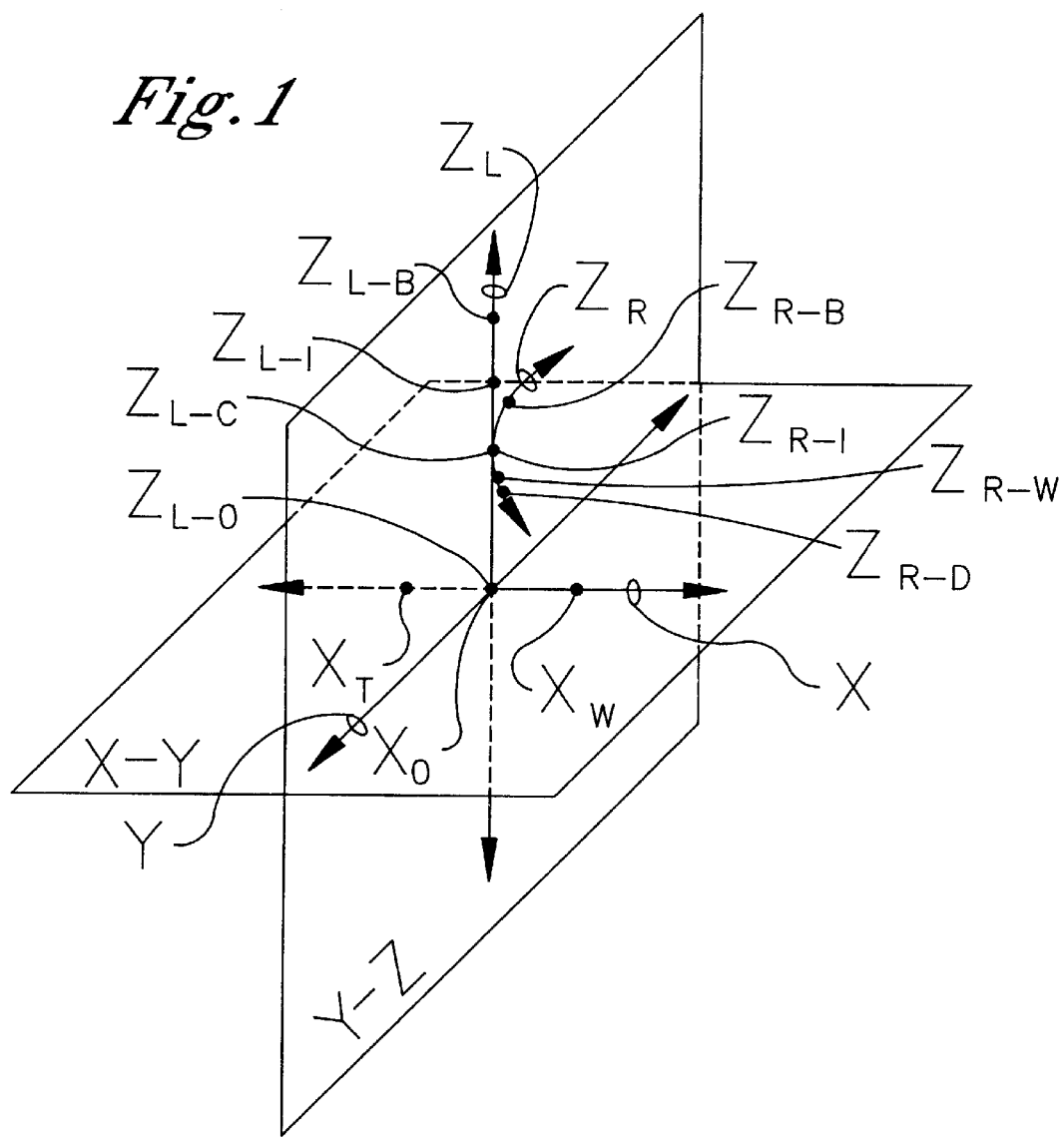
FIG. 1 is a graphical depiction of the axes along which a capillary is capable of moving relative to a workpiece during the practice of the tailless ball bump production method of the present invention.

The present invention relates to a method of operating a bond head for the production of tailless ball bumps. The operating method is generally applicable to a bond head having a bond tool which is capable of selective three-dimensional displacement along three different displacement axes. Referring to FIG. 1, the three displacement axes which define the displacement paths of the bond tool are a horizontal linear axis X, a vertical linear axis $Z_L$, and a vertical rotary axis $Z_R$. The bond tool of the applicable bond head is also typically, although not necessarily, capable of selective displacement along a fourth displacement axis, i.e., a horizontal linear axis Y. The horizontal linear axis X, horizontal linear axis Y, and vertical linear axis $Z_L$ are all oriented perpendicular to one another. The horizontal linear axis X and horizontal linear axis Y are contained within a horizontal plane X-Y. The vertical linear axis $Z_L$ and vertical rotary axis $Z_R$ are contained within a vertical plane Y-Z, which is oriented perpendicular to the horizontal plane X-Y.

A particular bond head, which is capable of performing the present operating method, is disclosed in U.S. Pat. No. 6,102,275, issued on Aug. 18, 2000, and commonly owned with the present invention. As such, U.S. Pat. No. 6,102,275 is incorporated herein by reference. The bond head of U.S. Pat. No. 6,102,275 is produced by Palomar Technologies, Inc., Vista, Calif., USA, and commercially available under the registered trademark "CBT 6000".

FIGS. 2–11 depict a time sequence of production steps performed by a bond head, which has a selectively displaceable bond tool during, one cycle of the present tailless ball bump production method. FIGS. 2–6, 8, 10 and 11 correlate the steps in the production cycle to selective horizontal and vertical displacement of the bond tool along the displacement axes X, $Z_L$ and $Z_R$ shown in FIG. 1. The resulting horizontal and vertical positions of the bond tool are specified with reference to distinct points on the displacement axes X, $Z_L$ and $Z_R$.

For purposes of illustration and clarity, the only components of the bond head shown in the drawings are the bond tool 10 (alternately termed a capillary) and a wire clamp 12. It is understood, however, that the capillary 10 and wire clamp 12 are connected to one or more other bond head components not shown. The one or more other bond head components support the capillary 10 and wire clamp 12 and enable selective displacement of the capillary 10 along the axes X, $Z_L$, and $Z_R$ relative to a workpiece 14, which is positioned in the horizontal plane X-Y.

The description of the present method set forth hereafter contains numerous recitations of the act of displacing the capillary relative to the workpiece 14. These recitations broadly encompass moving the capillary 10 while maintaining the workpiece 14 fixed, moving the workpiece 14 while maintaining the capillary 10 fixed, or moving both the capillary 10 and workpiece 14 simultaneously, but to different end points. Displacement of the capillary 10 relative to the workpiece 14 along the vertical linear axis $Z_L$, vertical rotary axis $Z_R$, and horizontal linear axes X and Y is preferably effected by moving the capillary 10 along the vertical linear axis $Z_L$, vertical rotary axis $Z_R$, and horizontal linear axes X and Y, respectively, while maintaining the workpiece 14 fixed. However, an acceptable alternative is to effect displacement of the capillary 10 relative to the workpiece 14 along the horizontal linear axes X or Y by moving the workpiece 14 along the horizontal linear axes X or Y while maintaining the capillary 10 fixed, in which case an underlying X-Y positioner may be employed as a dynamic support to move the workpiece 14.

Although not shown, it is noted that the wire clamp 12 of FIGS. 2–6, 8, 10 and 11 is preferably dynamically connected to the capillary 10. Accordingly, the wire clamp 12 is preferably capable of linear displacement along the linear axes X and $Z_L$ in synchronization with corresponding linear displacement the capillary 10. However, the wire clamp 12 is preferably incapable of vertical rotary displacement along the vertical rotary axis $Z_R$. Thus, the linear positions of the wire clamp 12 and capillary 10 on the linear axes X and $Z_L$ are essentially fixed relative to each other, while the vertical rotary position of the capillary 10 on the vertical rotary axis $Z_R$ can vary relative to the wire clamp 12.

Figure 2:
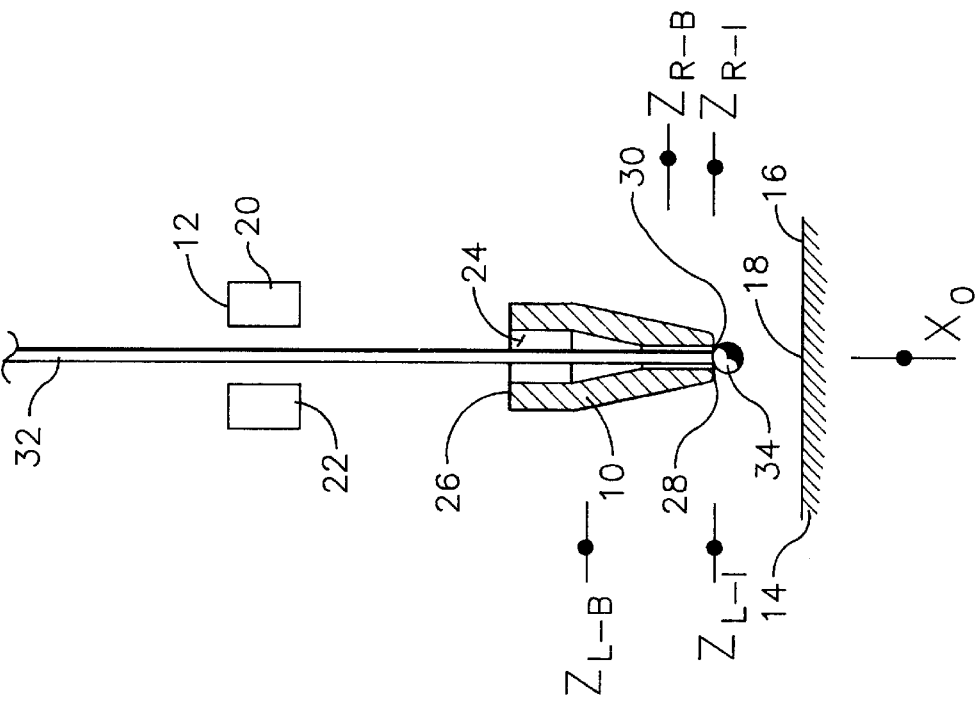

The general configuration and relative positions of the capillary 10, wire clamp 12 and workpiece 14 are described hereafter with specific reference to FIG. 2. The capillary 10 is positioned above the workpiece 14 on which a ball bump is to be produced. The workpiece 14 may be any number of structures having electronics applications, on which it is desirable to produce a ball bump, such as a waffle or a substrate. The workpiece 14 has a working surface 16 containing a bond site 18, which is the precise point on the working surface 16 with respect to the horizontal axis X where the ball bump is to be produced. The working surface 16 preferably is (or approximates) a flat planar area which is contained within the horizontal plane X-Y. Thus, the bond site 18 is correspondingly contained within the horizontal plane X-Y. The wire clamp 12 comprises a first jaw 20 and a second jaw 22 which oppose one another and are positioned above the capillary 10 at all times.

The capillary 10 is in communication with an ultrasonic transducer (not shown) to receive ultrasonic energy therefrom. The capillary 10 has an open passageway 24 extending the full length of the capillary 10 along the longitudinal axis thereof from an upper end 26 to a lower end 28. The upper end 26 is relatively wide and the lower end 28 tapers to a relatively narrow tip having an aperture 30 formed therein, which provides a continuous opening from the passageway 28 into the space below the capillary 10. The diameter of the passageway 24 and aperture 30 are sufficiently broad throughout their length to permit a thin wire 32 to travel vertically through the passageway 24 and aperture 30 into the space below the capillary 10 without substantial impediment. However, the diameter of the aperture 30 is sufficiently narrow to prevent a widened ball 34, which is positioned on the end of the wire 32 below the capillary 10, from traveling upward through the aperture 30 into the passageway 24. The ball 34 is formed on the end of the wire 32 in a manner described hereafter. For example, the wire 32 may have a diameter of 1 mil (25 microns), the ball 34 a diameter of 3 mil, and the aperture 30 a diameter of 1.5 mil.

The capillary 10 is designed to perform multiple functions, in particular, functioning as a wire guide, force applicator, energy conductor, and wire shearer in a manner described hereafter. Accordingly, the capillary 10 is preferably fabricated from a durable material, such as a ceramic, which is capable of transferring ultrasonic energy output from the ultrasonic transducer to the wire 32. The wire 32 is an electrically-conductive metal wire, preferably formed from gold, copper, or an alloy of either. The wire 32 is typically very fine, having a diameter which does not exceed about 2 mil. As is apparent from above, the size of the capillary 10 as well as its passageway 24 and aperture 30 are selected in correspondence with the size of the wire 32 and the performance requirements of the production method. The geometrical configuration of the capillary 10, particularly at the lower end 28, is also selected to achieve desirable wire shear characteristics during the wire shearing step as described hereafter.

The wire clamp 12 is designed to function in cooperation with the capillary 10. The opposing first and second jaws 20, 22 of the wire clamp 12 are selectively positionable in a closed position or an open position. In the closed position, the first and second jaws 20, 22 are drawn together to pinch the wire 32 between them, which prevents the wire 32 from traveling vertically through the first and second jaws 20, 22. In the open position, the first and second jaws 20, 22 are separated by a distance exceeding the diameter of the wire 32, which enables the wire 32 to travel vertically through the first and second jaws 20, 22 without substantial impediment therefrom.

FIG. 2 shows the relative positions of the capillary 10, wire clamp 12, wire 32 and workpiece 14 at the initiation of a production cycle. The initiation of the present production cycle corresponds to the completion of a previous production cycle since a plurality of production cycles are preferably performed continuously and repetitively in series over time in accordance with the present method. For purposes of the present description, the bond site 18 of the workpiece 14 is arbitrarily positioned at the intersection of the axes X, Y and $Z_L$. The horizontal position of the bond site 18 along the axis X is designated the horizontal bond point $X_0$. The vertical position of the bond site 18 along the axis $Z_L$ is similarly designated the vertical linear bond point $Z_{L\text{-}0}$ At initiation, the wire clamp 12 is in the closed position. The vertical linear position of the capillary 10 along the axis $Z_L$ is the vertical linear ball formation point $Z_{L\text{-}B}$, the vertical rotary position of the capillary 10 along the axis $Z_R$ is the vertical rotary ball formation point $Z_{R\text{-}B}$, and the horizontal linear position of the capillary 10 along the axis X is the horizontal bond point $X_0$. The wire 32 extends vertically linearly through the passageway 24 and aperture 30 of the capillary 10 downwardly into the space below the capillary 10. The ball 34 is positioned at the end of the wire 32 in the space below the capillary 10, which is between the aperture 30 and the bond site 18. A segment 36 of the wire 32 is exposed between the ball 34 and the aperture 30.

Figure 3:
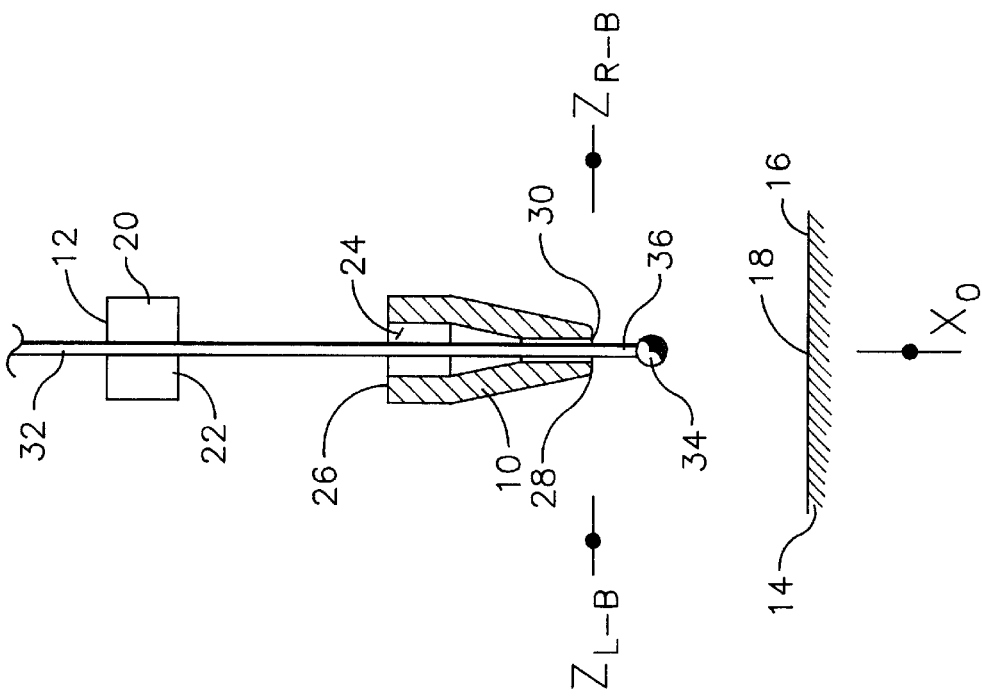

FIG. 3 shows the relative positions of the capillary 10, wire clamp 12, wire 32 and workpiece 14 after the initiating step of the production cycle. In accordance with the initiating step, the wire clamp 12 is repositioned from the closed position to the open position. Once the wire clamp 12 is in the open position, the capillary 10 is vertically linearly displaced downwardly along the axis $Z_L$ from the vertical linear ball formation point $Z_{L-B}$ to a vertical linear intermediate point $Z_{L-I}$ closer to the vertical linear bond point $Z_{L-0}$. The capillary 10 is also vertically rotationally displaced counterclockwise along the axis $Z_R$ from the vertical rotary ball formation point $Z_{R-B}$ to a vertical rotary intermediate point $Z_{R-I}$. When the capillary 10 is vertically rotationally positioned at the vertical rotary intermediate point $Z_{R-I}$, the wire 32 and passageway 24 are perpendicularly aligned with the horizontal plane X-Y containing the bond site 18. The aperture 30 is also positioned against the ball 34, which eliminates the exposed wire segment 36 below the aperture 30. It is noted that vertical rotary displacement of the capillary 10 to the vertical rotary intermediate point $Z_{R-I}$ and vertical linear displacement of the capillary 10 to the vertical linear intermediate point $Z_{L-I}$ may be performed simultaneously or sequentially after repositioning the wire clamp 12 to the open position. It is further noted that the horizontal linear position of the capillary 10 along the axis X is maintained at the horizontal bond point $X_0$ during the initiating step:

FIG. 4 shows the relative positions of the capillary 10, wire clamp 12, wire 32 and workpiece 14 after a first positioning step of the production cycle. In accordance with the first positioning step, the capillary 10 is vertically linearly displaced downwardly along the axis $Z_L$ from the vertical linear intermediate point $Z_{L-I}$ to a vertical linear contact point $Z_{L-C}$, which enables the bottom of the ball 34 to contact the bond site 18. A rotary servo system (not shown)y is used to detect contact between the ball 34 and the bond site 18, which determines when, the vertical linear contact point $Z_{L-C}$ is attained. The vertical rotary position of the capillary 10 along the axis $Z_R$ is maintained at the vertical rotary intermediate point $Z_{R-I}$ during the first positioning step, which enhances performance of the subsequent ball bump formation step described hereafter. In addition, the horizontal linear position of the capillary 10 along the axis X is maintained at the horizontal bond point $X_0$ and the wire clamp 12 is maintained open during the first positioning step.

Detection of contact between the ball 34 and bond site 18 initiates a bonding step of the production cycle. FIG. 5 shows the relative position's of the capillary 10, wire clamp 12, wire 32 and workpiece 14 after the bonding step. In accordance with the bonding step, a vertical rotary bonding force F having a given force magnitude is applied counterclockwise to the ball 34 along the axis $Z_R$ for a given force application time by means of the lower end 28 of the capillary 10. Ultrasonic energy having a given energy level, for example, 70% of the maximum energy output of the ultrasonic transducer, is simultaneously transmitted from the ultrasonic transducer through the lower end 28 of the capillary 10 to the ball 34 for a given energy application time. Heat energy may also be simultaneously applied to the ball 34 by an external heater (not shown), which elevates the temperature of the bond site 18, for example, to a temperature of about 150° C. The combined effect of the vertical rotary bonding force F, ultrasonic energy and heat energy deforms the ball 34 away from its original configuration and ultimately creates a thermal sonic bond between the ball 34 and the workpiece 14 at the bond site 18, wherein the primary bond parameters are the magnitude of the vertical rotary bonding force F, the level of the ultrasonic energy and heat energy, and the duration of the force and energy application times.

The original configuration of the ball 34 is typically substantially spherical or rounded, wherein the diameter of the ball 34 and height of the ball 34 are essentially identical dimensions. Deformation of the ball 34 at least partially flattens the ball 34 against the working surface 16 at the bond site 18 to reduce the height of the ball 34 above the working surface 16. Application of the vertical rotary bonding force F against the working surface 16 via the ball 34 may also to create an indentation in the working surface 16 which further reduces the height of the ball 34 above the working surface 16. In order for the lower end 28 of the capillary 10 to maintain contact with the ball 34 as the height of the ball 34 above the working surface 16 diminishes, the capillary 10 is vertically rotationally displaced counterclockwise along the axis $Z_R$ from the vertical rotary intermediate point $Z_{R-I}$ to a vertical rotary deformation point $Z_{R-D}$. The vertical linear position of the capillary 10 along the axis $Z_L$ is maintained at the vertical linear contact point $Z_{L-C}$, the horizontal linear position of the capillary 10 along the axis X is maintained at the horizontal bond point $X_0$, and the wire clamp 12 is also maintained open during the bonding step.

The vertical rotary distance that the capillary 10 travels along the axis $Z_R$ during the bonding step is correlated to the progress of the bonding step. In accordance with one embodiment, the instantaneous vertical rotary distance traveled by the capillary 10 along the axis $Z_R$ may be monitored throughout the bonding step to determine when the vertical rotary deformation point $Z_{R-D}$ is attained and to signal completion of the bonding step. In any case, at the completion of the bonding step, the ball 34 has fully transformed to a ball bump 38, which is the term used for the deformed ball 34 after it is bonded to the working surface 16. It is noted that vertical rotary displacement of the capillary 10 along the vertical rotary axis $Z_R$ causes a slight deviation of the passageway 24 from the vertical, taking the longitudinal axis of the capillary 10 slightly out of perpendicular alignment with the bond site 18. However, this deviation is not deemed significant for purposes of the present description because the arc length of vertical rotary displacement along the vertical rotary axis $Z_R$ is relatively small.

Figure 6:
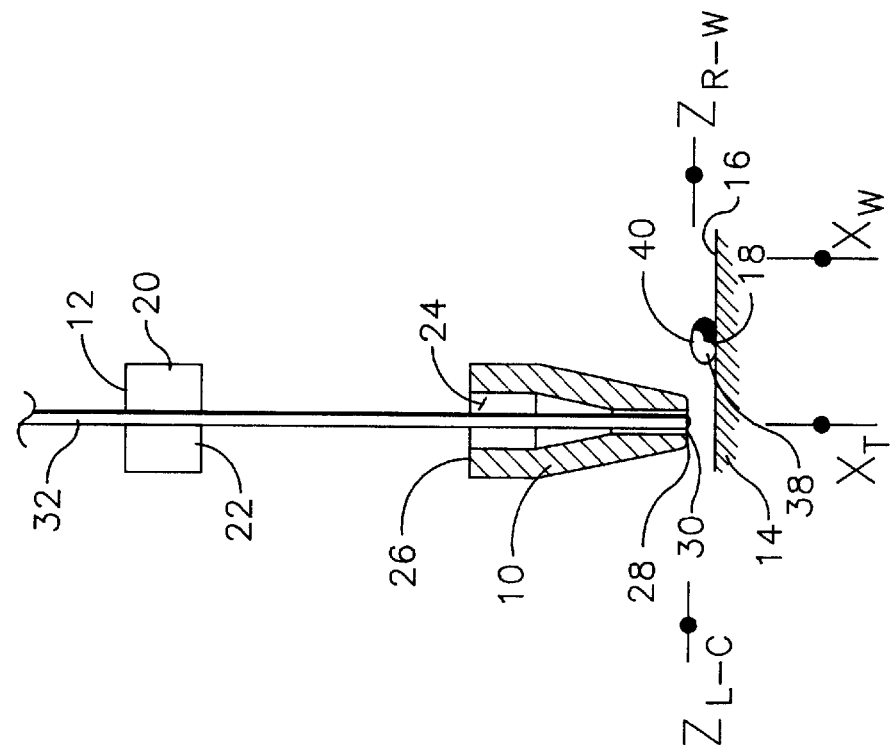

FIG. 6 shows the relative positions of the capillary 10, wire clamp 12, wire 32 and workpiece 14 after a wire shearing step of the production cycle. In accordance with the wire shearing step, the wire clamp 12 is maintained in the open position and application of the vertical rotary bonding force F to the ball bump 38 is terminated by vertically rotationally displacing the capillary 10 clockwise along the axis $Z_R$ from the vertical rotary deformation point $Z_{R-D}$ to a vertical rotary wire shear point $Z_{R-W}$. The distance between the vertical rotary deformation point $Z_{R-D}$ and the vertical rotary wire shear point $Z_{R-W}$ is essentially negligible, being only enough to withdraw the vertical rotary bonding force F from the ball bump 38 while maintaining the position of the lower end 28 of the capillary 10 essentially even with the top surface 40 of the ball bump 38.

Figure 7:
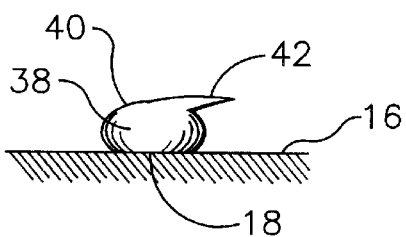
FIGS. 7 and 9 are conceptualized views of a ball bump after different steps of the production cycle.

The wire clamp 12 is repositioned from the open position to the closed position after the capillary 10 is vertically rotationally displaced to the vertical rotary wire shear point $Z_{R-W}$. The capillary 10 is, thereafter, horizontally linearly displaced laterally along the axis X away from the horizontal bond point $X_0$ to a horizontal wire shear point $X_W$, while maintaining the vertical linear position of the capillary 10 at the vertical linear contact point $Z_{L-C}$ and the vertical rotary position of the capillary 10 at the vertical rotary wire shear point $Z_{R-W}$. As the capillary 10 is displaced in a rightward direction away from the ball bump 38, the capillary 10 detaches the wire 32 from the ball bump 38 by shearing, i.e., cutting and/or tearing, the wire 32 away from the top surface 40 of the ball bump 38. The wire shearing step typically produces a residual wire tail 42 on the ball bump 38, which is a short stump of wire remaining on the ball bump 38 after detachment of the wire 32. The residual wire tail 42 extends away from the top surface 40 of the ball bump 38 in substantially the same direction that the capillary 10 is horizontally linearly displaced. FIG. 7 shows a conceptualized blow-up view of the ball bump 38 and the residual wire tail 42 extending from the top surface 40 after the wire shearing step.

Figure 8:
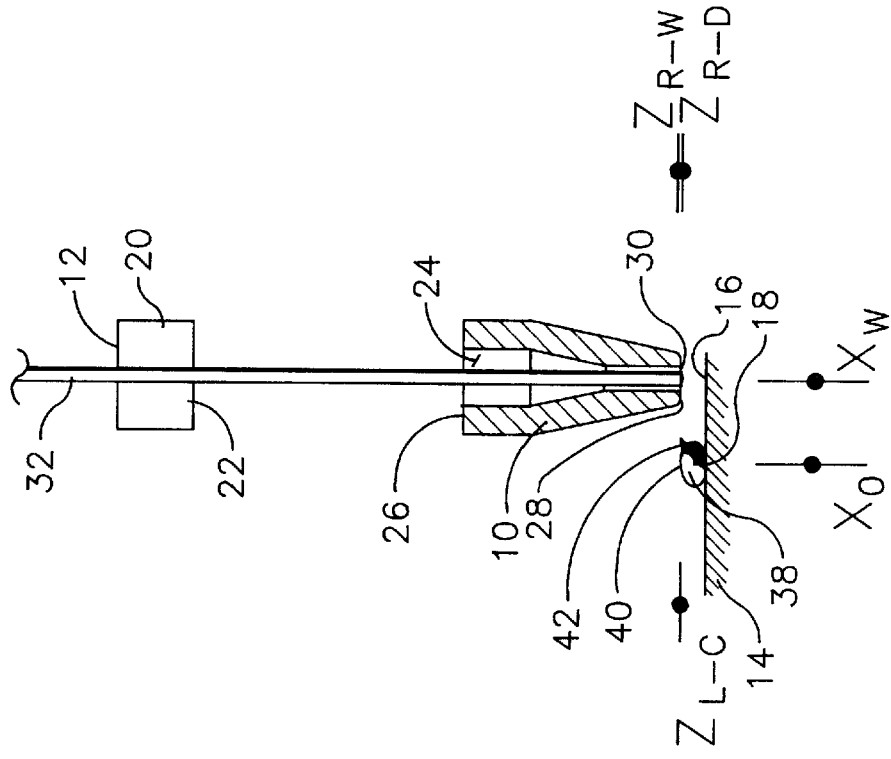

FIG. 8 shows the relative positions of the capillary 10, wire clamp 12, wire 32 and workpiece 14 after a residual wire tail removal step of the production cycle. In accordance with the residual wire tail removal step, the wire clamp 12 is maintained in the closed position. The capillary 10 is horizontally linearly displaced laterally along the axis X in substantially the opposite direction as the wire shearing step. In particular, the capillary 10 is horizontally linearly displaced along the axis X from the horizontal wire shear point $X_W$, past the horizontal bond point $X_0$, to a horizontal tail removal point $X_T$. The horizontal tail removal point $X_T$ and horizontal wire shear point $X_W$ are typically approximately equidistant from the horizontal bond point $X_0$ on opposite sides thereof. The vertical linear position of the capillary 10 is maintained at the vertical linear point $Z_{L-C}$ and the vertical rotary position of the capillary 10 is maintained at the vertical rotary wire shear point $Z_{R-W}$, while the capillary 10 is horizontally linearly displaced to the horizontal tail removal point $X_T$. As the lower end 28 of the capillary 10 is displaced in a leftward direction toward the top surface 40 of the ball bump 38, the lower end 28 contacts the residual wire tail 42 extending away from the top surface 40 of the ball bump 38.

Figure 9:
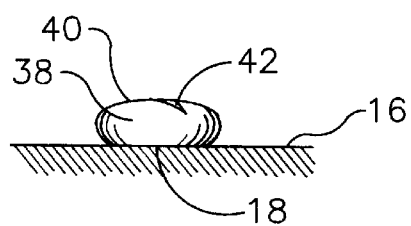

A reduced level of ultrasonic energy, for example, 50% of the maximum energy output, is preferably simultaneously transmitted from the ultrasonic transducer to the lower end 28 of the capillary 10 as the capillary 10 is horizontally linearly displaced along the axis X to the horizontal tail removal point $X_T$. The combined effect of the ultrasonic energy and horizontal linear motion of the lower end 28 of the capillary 10 relative to the ball bump 38 sweeps the residual wire tail 42 back toward the top surface 40 of the ball bump 38. As the lower end 28 of the capillary 10 passes across the top surface 40 of the ball bump 38, the lower end 28 folds the residual wire tail 42 over the top surface 40 and preferably integrates the residual wire tail 42 by thermal sonic bonding into the top surface 40, thereby rendering the top surface 40 continuously smoother and free of the residual wire tail 42 extending therefrom. FIG. 9 shows a conceptualized blow-up view of the ball bump 38 after the residual wire tail removal step, wherein the residual wire tail 42 has been thermal sonic bonded into the top surface 40. For purposes of illustration, a demarcation is shown between the residual wire tail 42 and the top surface 40, although in practice the residual wire tail 42 would preferably be integral with the top surface 40.

As the lower end 28 continues across the remainder of the top surface 40, the lower end 28 also flattens any other residual physical irregularities, which may be present in the top surface 40 following the bonding or wire shearing steps, to further smooth the top surface 40. As a result, a desired height of the ball bump 38 is accurately and reproducibly established. Contact between the lower end 28 of the capillary 10 and the top surface 40 of the ball bump 38 additionally functions to free the end of the wire 32 should the wire 32 become stuck in aperture 30 during the wire shearing step, thereby preparing the wire 32 for the wire segment exposure, second positioning, and ball formation steps described hereafter. When the capillary 10 reaches the horizontal tail removal point $X_T$, formation of the desired ball bump product is completed.

FIG. 10 shows the relative positions of the capillary 10, wire clamp 12, wire 32 and workpiece 14 after a wire segment exposure step of the production cycle. In accordance with the wire segment exposure step, the capillary 10 is vertically rotationally displaced clockwise along the axis $Z_R$ from the vertical rotary wire shear point $Z_{R-W}$ back to the vertical rotary ball formation point $Z_{R-B}$. The vertical linear position of the capillary 10 is maintained at the vertical linear contact point $Z_{L-C}$, the horizontal position of the capillary 10 along the axis X is maintained at the horizontal tail removal point $X_T$ and the wire clamp 12 is maintained in the closed position. As a result, a new wire segment 36 having a predetermined length is exposed beneath the aperture 30 of the capillary 10.

FIG. 11 shows the relative positions of the capillary 10, wire clamp 12, wire 32 and workpiece 14 after a second positioning step of the production cycle. In accordance with the second positioning step, the capillary 10 is vertically linearly displaced along the axis $Z_L$ from the vertical linear contact point $Z_{L-C}$ back to the vertical linear ball formation point $Z_{L-B}$. The vertical rotary position of the capillary 10 is maintained at the vertical rotary ball formation point $Z_{R-B}$, the horizontal position of the capillary 10 along the axis X is maintained at the horizontal tail removal point $X_T$ and the wire clamp 12 is maintained in the closed position. Accordingly, the wire segment 36 is in a position for a ball formation step. In accordance with the ball formation step, an electronic flame off wand (not shown) is repositioned from a clearance position to an active position directly beneath the wire segment 36 and fired to create an arc plasma which transforms a portion of the wire segment 36 into the ball 34 at the end of the wire 32. Although the ball 34, as characterized above, typically has a substantially spherical or rounded configuration, the ball 34 is more broadly characterized as a bead of metal formed on the end of the wire 32 with substantially any geometric configuration which has a diameter or other cross sectional dimensions substantially greater than the wire 32 and a height substantially greater than the height of the subsequent ball bump 38.

After the ball 34 is formed, the wand is repositioned to the clearance position and the capillary 10 is horizontally linearly displaced laterally in a rightward direction along the axis X from the horizontal tail removal point $X_T$ back to the horizontal bond point $X_0$, which completes the ball formation step. The ball formation step returns the capillary 10, wire clamp 12, wire 32 and workpiece 14 to their original positions shown in FIG. 2. Completion of the ball formation step signifies completion of the present production cycle. Further production cycles may then be performed at additional bond sites without interruption in accordance with the same above-recited sequence of steps.

The present tailless ball bump method has been described above as transmitting ultrasonic energy to the capillary 10 during the bonding and residual wire tail removal steps to facilitate ball bump formation, bonding of the ball bump 38 to the bond site 18, and melding of the residual wire tail 42 back into the ball bump 38. It is apparent that ultrasonic energy can also be transmitted to the capillary 10 during the wire shearing step to facilitate detaching the wire 32 from the top surface 40 of the ball bump 38. Alternatively, ultrasonic energy can be transmitted to the capillary 10 continuously during the entire production cycle. It is understood by the skilled artisan that the level of ultrasonic energy transmitted to the capillary 10 in each of the steps may vary depending on the particular energy requirements of the step. For example, as shown above, the energy requirements for the residual wire tail removal step, and likewise the wire shearing step, are typically less than those for the bonding step. Thus, it is within the purview of the skilled artisan to operate the bond head in accordance the variable energy requirements of each step.

The present tailless ball bump method is not limited by any specific process control steps for operation of the bond head other than those recited above. Given the strict tolerances which must be attained in the production of ball bumps for many microelectronic applications, however, operation of the bond head in accordance with the present method generally necessitates computerized process control. As such, the practitioner performs the tailless ball bump method by predetermining the values for the numerous process parameters and inputting the predetermined values of the parameters into a control computer for bond head operation. The control computer employs specific applications software utilizing the predetermined parameter values to direct operation of the bond head with a much higher degree of precision than could otherwise be achieved by the practitioner.

It is noted that the terms "vertical" and "horizontal", "upper" and "lower", and "left" and "right" have been used herein to denote the spatial orientation and/or directional displacement of the elements of a bond head, wire and workpiece relative to one another as displayed in the drawings for the purpose of describing the invention. The terms do not necessarily reflect the spatial orientation and/or directional displacement of the elements in absolute terms with respect to the external environment when the elements are in a preferred operational orientation.

While the forgoing preferred embodiments of the invention have been described and shown, it is understood that alternatives and modifications, such as those suggested and others, may be made thereto and fall within the scope of the invention.

I claim:

1. A method for producing a ball bump on a workpiece comprising the steps of:
   providing a capillary having a passageway through said capillary and an opening from said passageway out of said capillary;
   positioning a wire in said passageway and extending an end of said wire from said opening, wherein a ball is positioned on said end;
   positioning said capillary proximal to a working surface on a workpiece and positioning said ball on a bond site on said working surface;
   applying a force against said ball in a direction of said bond site with said capillary to transform said ball to a ball bump;
   displacing said capillary in a first direction away from said ball bump to detach said wire from said ball bump and form a residual wire tail extending from said ball bump; and
   displacing said capillary in a second direction across said ball bump to engage said residual wire tail and return said residual wire tail to said ball bump.

2. The method of claim 1, wherein said second direction is a horizontal direction substantially opposite said first direction.

3. The method of claim 1 further comprising transmitting ultrasonic energy to said ball while applying said force.

4. The method of claim 1 further comprising heating said ball while applying said force.

5. The method of claim 1 further comprising terminating said force against said ball bump before displacing said capillary in said first direction.

6. The method of claim 1 further comprising engaging said ball bump with said capillary while displacing said capillary in said second direction across said ball bump to render said ball bump substantially smoother where engaged by said capillary.

7. The method of claim 1 further comprising flattening said residual wire tail against said ball bump after returning said residual wire tail to said ball bump.

8. The method of claim 1 further comprising bonding said residual wire tail to said ball bump after returning said residual wire tail to said ball bump.

9. The method of claim 1 further comprising transmitting ultrasonic energy to said residual wire tail after returning said residual wire tail to said ball bump.

10. The method of claim 1 further comprising heating said residual wire tail after returning said residual wire tail to said ball bump.

11. The method of claim 1, wherein said bond site is a first bond site and said ball bump is a first ball bump, said method further comprising repeating said steps of claim 1 to form a second ball bump on a second bond site.

12. A method for producing a ball bump on a workpiece comprising the steps of:
    providing a capillary having a passageway through said capillary and having an opening from said passageway out of said capillary;
    positioning a wire in said passageway and extending an end of said wire from said opening, wherein a ball having a ball height is positioned on said end;
    positioning said capillary proximal to a working surface on a workpiece and positioning said ball on a bond site on said working surface;
    applying a force against said ball in a direction of said bond site with said capillary to convert said ball to a ball bump having a top surface and a ball bump height above said working surface, wherein said ball bump height above said working surface is less than said ball height;
    displacing said capillary in a first direction away from said ball bump to detach said wire from said ball bump and form a residual wire tail extending away from said top surface of said ball bump; and
    displacing said capillary in a second direction across said top of said ball bump to engage said residual wire tail and substantially flatten said wire tail against said top surface of said ball bump.

13. The method of claim 12, wherein said second direction is a horizontal direction substantially opposite said first direction.

14. The method of claim 12 further comprising transmitting ultrasonic energy to said ball while applying said force.

15. The method of claim 12 further comprising heating said ball while applying said force.

16. The method of claim 12 further comprising terminating said force against said ball bump before displacing said capillary in said first direction.

17. The method of claim 12 further comprising engaging said top surface of said ball bump with said capillary while displacing said capillary in said second direction across said ball bump to render said top surface substantially smoother where engaged by said capillary.

18. The method of claim 12 further comprising bonding said residual wire tail to said top surface of said ball bump after returning said residual wire tail to said top surface.

19. The method of claim 12 further comprising transmitting ultrasonic energy to said residual wire tail after returning said residual wire tail to said top surface of said ball bump.

20. The method of claim 12 further comprising heating said residual wire tail after returning said residual wire tail to said top surface of said ball bump.

21. The method of claim 12, wherein said bond site is a first bond site and said ball bump is a first ball bump, said method further comprising repeating said steps of claim 1 to form a second ball bump on a second bond site.

22. A method for producing a ball bump on a workpiece comprising the steps of:

providing a bond head having a capillary;

extending a wire downwardly from said capillary, said wire having an end positioned beneath said capillary and having a ball suspended from said end;

positioning said capillary along a vertical linear axis at a vertical linear point;

providing a bond site on a working surface of a workpiece, wherein said bond site is positioned along a horizontal linear axis at a horizontal bond point and along said vertical linear axis below said vertical linear point, further wherein said ball is suspended from said wire above said bond site;

displacing said capillary along said vertical linear axis to a vertical linear contact point beneath said vertical linear point, thereby positioning said ball on said bond site;

applying a force against said ball in a direction of said bond site with said capillary to deform said ball and form a ball bump having a surface, wherein said wire extends from said surface of said ball bump;

displacing said capillary along said horizontal linear axis to a horizontal wire shear point away from said horizontal bond point, thereby detaching said wire from said ball bump and forming a residual wire tail extending from said surface of said ball bump; and displacing said capillary along said horizontal linear axis away from said horizontal wire shear point across said surface of said ball bump to a horizontal tail removal point on another side of said horizontal bond point from said horizontal wire shear point to engage said residual wire tail and return said residual wire tail to said surface of said ball bump.

23. A method for producing a ball bump on a workpiece comprising the steps of:

providing a bond head having a capillary and a wire clamp, wherein said wire clamp is selectively positionable in an open position or a closed position;

extending a wire downwardly from said wire clamp and said capillary, said wire having an end positioned beneath said capillary and having a ball suspended from said end;

positioning said capillary along a vertical linear axis at a vertical linear point and along a vertical rotary axis at a vertical rotary point;

providing a bond site on a working surface of a workpiece, wherein said bond site is positioned along a horizontal linear axis at a horizontal bond point, and further wherein said ball is suspended from said wire above said bond site;

maintaining said wire clamp in said open position thereby enabling displacement of said wire relative to said wire clamp;

displacing said capillary along said vertical linear axis to a vertical linear contact point beneath said vertical linear point, thereby positioning said ball on said bond site;

applying a force along said vertical rotary axis against said ball in a direction of said bond site with said capillary and transmitting energy through said capillary to said ball to deform said ball and bond said ball to said bond site, thereby forming a ball bump having a surface, wherein said wire extends from said surface of said ball bump;

radially displacing said capillary along said vertical rotary axis from said vertical rotary point to a vertical rotary deformation point in response to deforming said ball;

radially displacing said capillary along said vertical rotary axis to withdraw said force from against said surface of said ball bump;

repositioning said wire clamp from said open position to said closed position to releasably fix said wire relative to said wire clamp;

displacing said capillary along said horizontal linear axis to a horizontal wire shear point away from said horizontal bond point, thereby detaching said wire from said ball bump and forming a residual wire tail extending from said surface of said ball bump; and displacing said capillary along said horizontal linear axis away from said horizontal wire shear point across said surface of said ball bump to a horizontal tail removal point on another side of said horizontal bond point from said horizontal wire shear point to engage said residual wire tail and return said residual wire tail to said surface of said ball bump.

* * * * *